(12) United States Patent
Ding et al.

(10) Patent No.: US 8,451,883 B1
(45) Date of Patent: May 28, 2013

(54) ON-CHIP FULL EYE VIEWER ARCHITECTURE

(75) Inventors: Weiqi Ding, Fremont, CA (US); Mingde Pan, Morgan Hill, CA (US); Sergey Shumarayev, Los Altos Hills, CA (US); Peng Li, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 562 days.

(21) Appl. No.: 12/630,674

(22) Filed: Dec. 3, 2009

(51) Int. Cl.
*H04B 3/46* (2006.01)

(52) U.S. Cl.
USPC .......................................................... 375/228

(58) Field of Classification Search
USPC .......................... 375/226, 228, 232, 316, 355
See application file for complete search history.

(56) References Cited

U.S. PATENT DOCUMENTS

| | | | |
|---|---|---|---|
| 4,881,243 A * | 11/1989 | Whitt ............................ | 375/215 |
| 6,973,407 B1 | 12/2005 | Abraham | |
| 6,995,553 B1 * | 2/2006 | Nygaard, Jr. ................ | 324/76.19 |
| 7,049,859 B2 | 5/2006 | Boyer et al. | |
| 8,074,126 B1 * | 12/2011 | Qian et al. ..................... | 714/704 |
| 2005/0226355 A1 * | 10/2005 | Kibune et al. ................. | 375/348 |
| 2006/0020407 A1 * | 1/2006 | Montijo et al. ................. | 702/67 |
| 2009/0154542 A1 | 6/2009 | Ding et al. | |
| 2009/0154591 A1 | 6/2009 | Wong et al. | |
| 2010/0329325 A1 * | 12/2010 | Mobin et al. .................. | 375/232 |
| 2011/0228864 A1 * | 9/2011 | Aryanfar et al. .............. | 375/259 |

OTHER PUBLICATIONS

Machine English translation of JP 2007-060655. Translation dated Nov. 11, 2011.*

* cited by examiner

*Primary Examiner* — Don N Vo
(74) *Attorney, Agent, or Firm* — Fletcher Yoder P.C.

(57) ABSTRACT

Systems, methods, and devices for determining an eye diagram of a serial input signal to an integrated circuit without an oscilloscope are provided. For example, one embodiment of an integrated circuit device may be capable of determining an eye diagram associated with an equalized serial input signal. The device may include an equalizer and eye viewer circuitry. The equalizer may receive and perform equalization on a serial input signal to produce the equalized serial input signal, and the eye viewer circuitry may determine horizontal and vertical boundaries of the eye diagram associated with the equalized serial input signal.

29 Claims, 10 Drawing Sheets

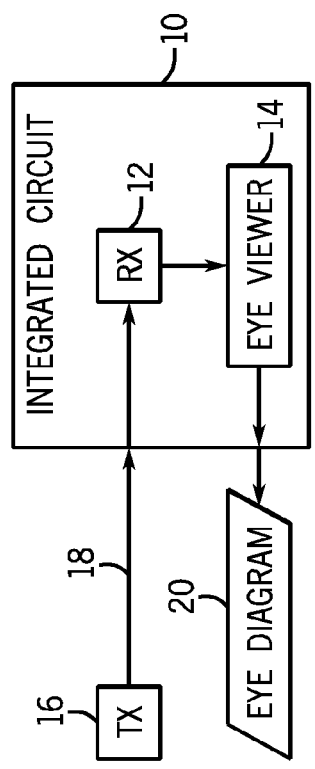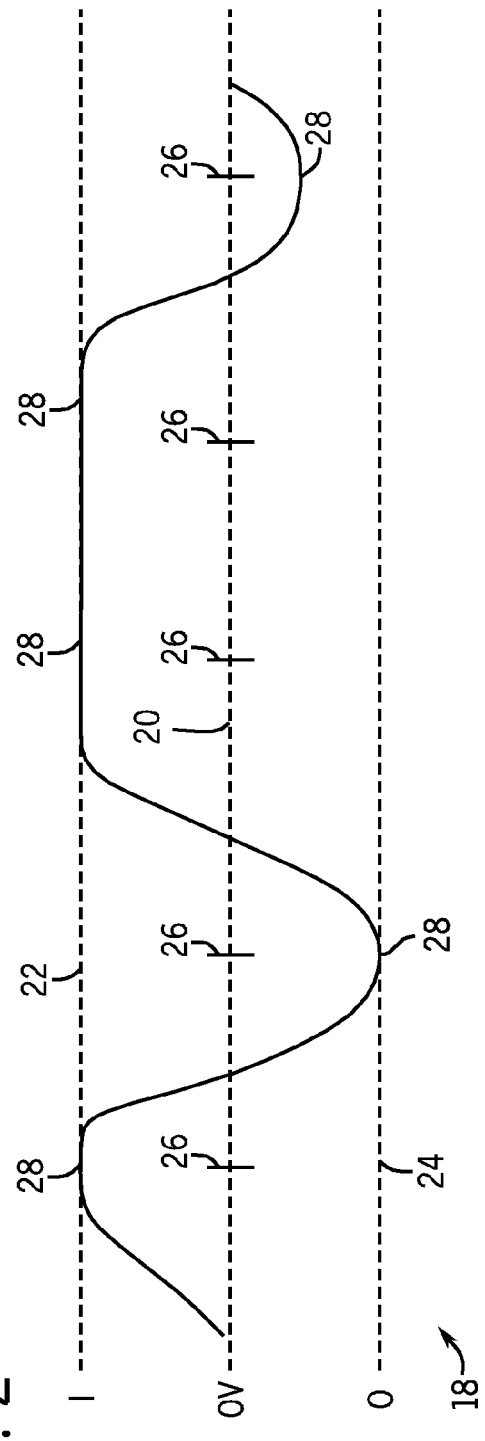
FIG. 1
FIG. 2

ON-CHIP FULL EYE VIEWER ARCHITECTURE

BACKGROUND

The present disclosure relates generally to high-speed serial data communication and, more particularly, to obtaining eye diagrams associated with such high-speed serial data communication after equalization.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

In high-speed serial interface (HSSI) applications, a high-speed serial input signal (e.g., between approximately 6-12 Gbps) to a receiver (RX) of an integrated circuit (IC) device may become attenuated and distorted due to frequency-dependent signal loss across interconnects. One form of distortion that may affect the input signal is intersymbol interference (ISI), which occurs when one data bit of the serial signal interferes with a subsequent data bit. Increases in ISI may produce a measurable degradation of the input signal quality, and the margins of clock and data recovery (CDR) circuitry may be affected.

A variety of RX equalization and signal modeling techniques have been explored to improve the RX input signal before reaching clock and data recovery circuitry in the RX. For example, one common way to evaluate ISI in a high-speed serial input signal involves observing an eye diagram associated with the signal. An eye diagram may result when the wave form of each data bit of the signal is superimposed onto a single bit time interval, or unit interval (UI). Typically obtained by probing the high-speed serial input signal with an oscilloscope, an eye diagram is so named because the resulting superimposition of the bits of the high-speed serial signal forms the general shape of an open eye. A higher-quality serial signal generally has a more "open" eye diagram, while a lower-quality serial signal generally has a more "closed" eye diagram.

An eye diagram may enable designers or field engineers to visualize and correct for some ISI of a high-speed serial input signal, as well as other jitter compounds of the signal. However, an IC may generally include equalization circuitry to improve the quality of the signal, the output of which may be internal to sensitive high-speed nodes that may not be probed with an oscilloscope. Moreover, with or without equalization circuitry, any internal serial signals may become distorted by the RX circuitry or by on-die connections. As such, the ISI of the post-equalization signal or of other internal serial signals typically may not be visualized.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Present embodiments relate to systems, methods, and devices for determining an eye diagram of a serial input signal to an integrated circuit without an oscilloscope. In particular, the present embodiments may enable determination of an eye diagram for such a serial input signal after the signal has been equalized, when it may be difficult or impossible to obtain a traditional eye diagram with an oscilloscope. For example, one embodiment of an integrated circuit device may be capable of determining an eye diagram associated with an equalized serial input signal. The device may include an equalizer and eye viewer circuitry. The equalizer may receive and perform equalization on a serial input signal to produce the equalized serial input signal, and the eye viewer circuitry may determine horizontal and vertical boundaries of the eye diagram associated with the equalized serial input signal.

BRIEF DESCRIPTION OF THE DRAWINGS

Various aspects of this disclosure may be better understood upon reading the following detailed description and upon reference to the drawings in which:

FIG. 1 is a block diagram of an integrated circuit having circuitry for determining an eye diagram of a high-speed serial input signal after equalization of the signal, in accordance with an embodiment;

FIG. 2 is an exemplary high-speed serial input signal for use by the integrated circuit of FIG. 1, in accordance with an embodiment;

DETAILED DESCRIPTION OF SPECIFIC EMBODIMENTS

Figure 3:
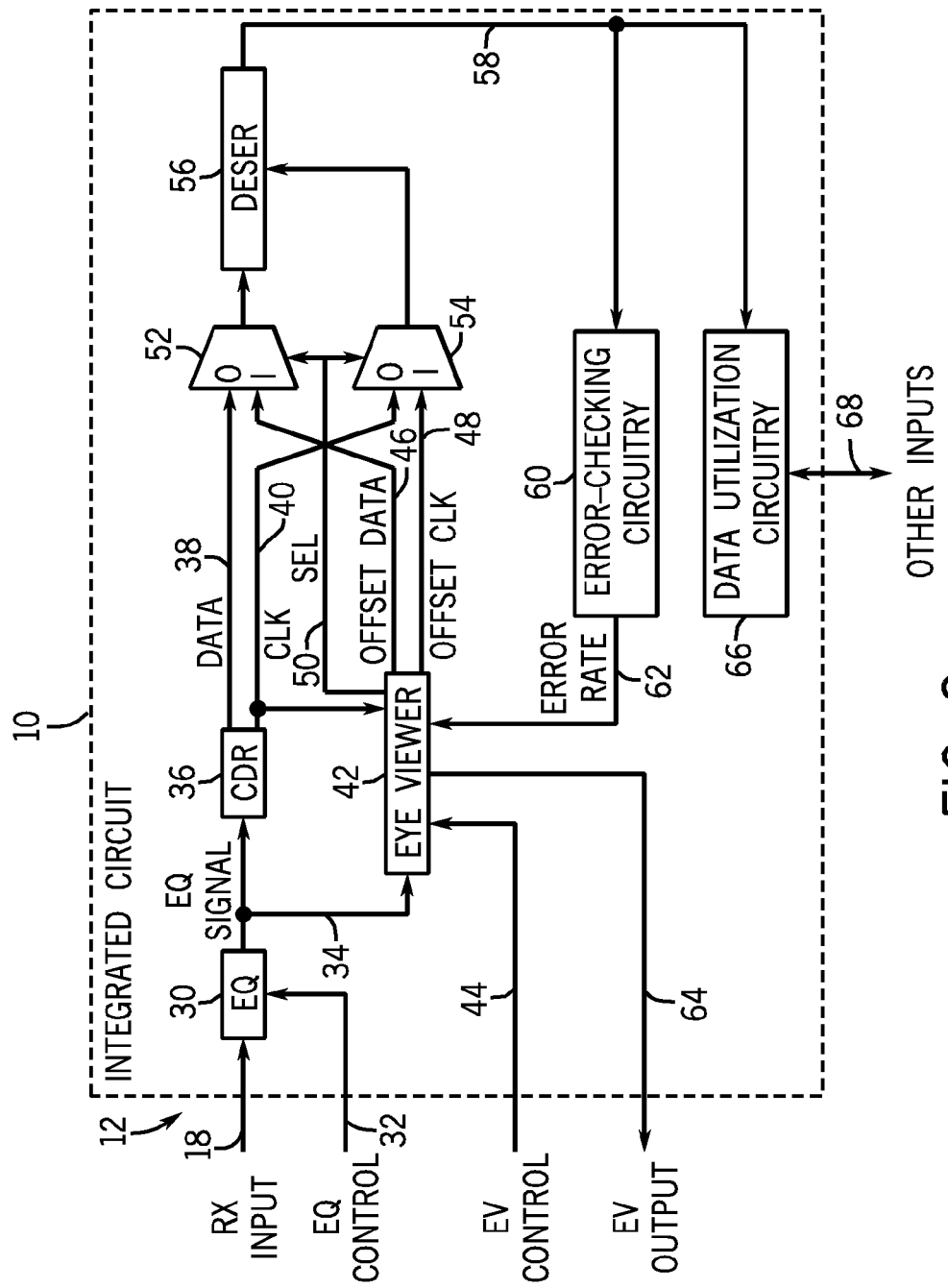
FIG. 3 is a block diagram of the integrated circuit of FIG. 1, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present disclosure relate to circuitry for generating eye diagrams of high-speed serial signals to an integrated circuit (IC) that are propagated via circuitry internal to the IC, such as serial signals that have passed through an equalizer (EQ). In particular, ICs that may receive high-speed serial input signals (e.g., between approximately 6-12 Gbps) may have signal paths too sensitive for oscilloscope probes to test the signals after equalization. Using the eye viewer circuitry described below, a designer or field engineer may obtain an eye diagram of a high-speed serial input signal after the signal has passed through EQ circuitry or is propagating through other sensitive locations on an integrated circuit. By observing the eye diagram of the equalized signal, the designer of field engineer may adjust the EQ to improve the signal quality or may diagnose the receiver path.

The eye viewer circuitry may determine not only horizontal boundaries of the eye diagram associated with the equalized signal, but also vertical boundaries. Based on the determined horizontal and vertical boundaries, a two-dimensional (2-D) visualization of the eye diagram may be constructed. Moreover, the eye viewer circuitry may also indicate an error rate (e.g., a bit error rate (BER) or a cyclic redundancy check (CRC) error rate) at various points within the horizontal and vertical boundaries. The error rates may be used to construct a three-dimensional (3-D) visualization of the eye diagram, in which the error rates at the various points throughout the eye diagram are represented as third-dimension distances and/or colors.

To determine the eye diagram associated with the equalized high-speed serial input signal, the eye viewer circuitry may include a phase interpolator (PI), a threshold variable comparator (TVC), and control logic. The PI may receive a clock signal associated with the equalized input signal and may output a clock signal with a phase offset by an amount indicated by the control logic. This offset clock may feed into the TVC, which may sample the equalized input signal at a threshold voltage Vt supplied by the control logic. The control logic may vary the phase offset and the threshold voltage Vt to recover data at various points in the eye of the equalized input signal. By testing the error rate of this recovered data at various points in the eye, eye diagram boundaries may be determined, which may occur when the error rate exceeds a threshold level of acceptable error.

With the foregoing in mind, FIG. 1 illustrates a block diagram of an integrated circuit (IC) 10 having a receiver (RX) 12 and eye viewer circuitry 14. The IC 10 may be any integrated circuit having the RX 12 and eye viewer circuitry, and may be, for example, a programmable logic device (PLD) from the Stratix® family of FPGA devices by Altera Corporation. A transmitter (TX) 16 may provide a high-speed (e.g., between approximately 6-12 Gbps) serial input signal 18 to the RX 12. When desired, the RX input signal 18 may enter the eye view circuitry 14 after equalization, which may output eye diagram data 20. Additionally or alternatively, the RX input signal 18 or any other serial signal internal to the IC 10 may enter the eye viewer circuitry 14, which may output eye diagram data 20 particular to the serial signal. The eye diagram data 20 may represent information sufficient for construction of a two-dimensional (2-D) or three-dimensional (3-D) eye diagram associated with the particular serial signal.

One example of such an RX input signal 18 is provided in FIG. 2. The RX input signal 18 may be a single high-speed serial signal of between approximately 6-12 Gbps, which may or may not be transmitted with a separate clock signal. Centered around approximately 0V, as indicated by numeral 20, a voltage level greater than 0V may be considered a binary 1, while a voltage lower then 0V may be considered a binary 0, as respectively indicated by numerals 22 and 24, or vice-versa. At a regular clock interval, indicated by numeral 26, each bit 28 of the signal may be determined based on its relationship to 0V.

As shown in FIG. 2, the RX input signal 18 may not always precisely reach a maximum high and maximum low upon entering the RX 12 of the integrated circuit 10. Indeed, in certain situations, intersymbol interference (ISI) may occur. Due to frequency dependencies and bandwidth limitations of the backplane through which the RX input signal 18 may travel, certain bits 28 may fail to reach the maximum or minimum voltage at the clock interval 26. One such example is illustrated by the final low bit 28 of the RX input signal 18 of FIG. 2, which follows to sequential high bits 28. If the RX input signal 18 exhibits excessive ISI, data errors may result. Because the RX input signal 18 will pass through equalization (EQ) circuitry in the RX 12, and adjustments to the EQ circuitry may reduce ISI, the eye viewer circuitry 14 may determine an eye diagram of the RX input signal 18 after the RX input signal 18 has passed through the EQ circuitry.

FIG. 3 is a block diagram of the integrated circuit (IC) 10. As shown in FIG. 3, when the receiver (RX) input signal 18 enters the receiver (RX) 12 of the IC 10, the RX input signal 18 may pass through an equalizer (EQ) 30. The EQ 30 may adjust the gain or bandwidth of the RX input signal 18, which may improve the signal quality. In certain embodiments, an equalization (EQ) control signal 32 may enable modification of the equalization procedures of the EQ 30 by changing programmable or reprogrammable components of the IC 10 pertaining to the operation of the EQ 30.

When the RX input signal 18 has passed through the EQ 30, an equalized (EQ) signal 34 may result. The EQ signal 34 may enter clock and data recovery (CDR) circuitry 36, which may obtain from the EQ signal 34 a recovered data signal 38 and recovered clock signal 40. When the IC 10 is operating in an eye viewer mode, eye viewer circuitry 42 may analyze the EQ signal 34 to obtain an eye diagram. The eye viewer circuitry 42 may receive the EQ signal 34 and the recovered clock signal 40 as inputs, and may output an offset data signal 46 and an offset clock signal 48, which may represent data sampled from certain points in the eye of the EQ signal 34. For this reason, as described in greater detail below, the offset data signal 46 and the offset clock signal 48 may be used in determining an eye diagram associated with the EQ signal 34.

Eye viewer (EV) control signals 44 may activate and provide certain parameters for the operation of the eye viewer circuitry 42. For example, the EV control signals 44 may cause the eye viewer circuitry 42 to enable a transition from a normal mode of operation to an eye viewer mode of operation. To do so, the eye viewer circuitry 42 may output a select signal 50, which may cause a multiplexer 54 to output the offset clock signal 48 rather than the recovered clock signal 40. At the same time, the select signal 50 may cause another multiplexer 52 to output the offset data signal 46 rather than the recovered data signal 38. A deserializer 56 may use these signals 46 and 48 to produce a parallel data signal 58. Error checking circuitry 60 may detect errors in the parallel data signal 58 and output an error rate 62, which may represent a bit error rate (BER) and/or a cyclic redundancy check (CRC) error rate.

In general, if the parallel data signal 58 represents data sampled from the center of the eye of the EQ signal 34, the error rate signal 62 may be relatively low (e.g., a BER approaching approximately $10^{-12}$ or less). However, when the offset data signal 46 and the offset clock signal 48 approach the boundaries of the eye of the EQ signal 34, the error rate signal 62 may be relatively high (e.g., a BER approaching approximately $10^{-6}$ or greater). Thus, the eye viewer circuitry 42 may determine the boundaries of the eye of the EQ signal 34 based on whether the error rate signal 62 indicates an error rate that exceeds a maximum acceptable threshold (e.g., a BER of approximately $10^{-6}$ or $10^{-12}$). From such determinations, the eye viewer circuitry 42 may output an eye viewer (EV) output signal 64, which may represent data sufficient to construct an eye diagram associated with the EQ signal 34.

The IC 10 may also include other elements, represented in FIG. 3 as data utilization circuitry 66. The data utilization circuitry 66 may represent, for example, field programmable gate array (FPGA) programmable or reprogrammable elements. Other inputs 68 may enable external communication with the data utilization circuitry 66.

Figure 4:
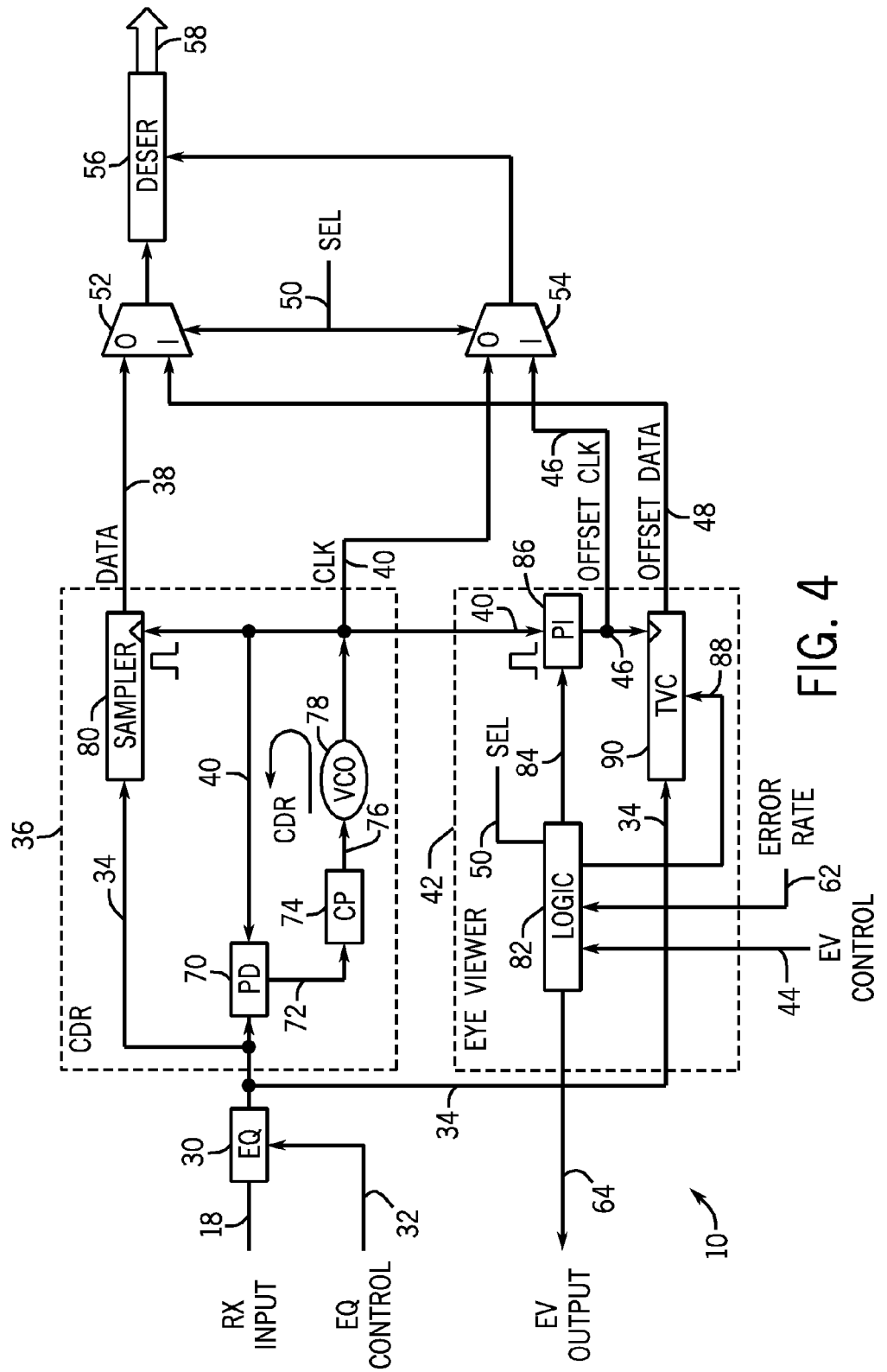
FIG. 4 is a block diagram illustrating circuitry for determining an eye diagram after equalization, in accordance with an embodiment.

FIG. 4 is a block diagram that provides a description of the clock and data recovery (CDR) circuitry 36 and the eye viewer circuitry 42 in greater detail. As illustrated in FIG. 4, after the receiver (RX) input signal 18 has been equalized in the equalizer (EQ) 30, the resulting equalized (EQ) signal 34 may enter the CDR circuitry 36. To recover the clock signal 40 associated with the EQ signal 34, a phase detector (PD) 70 may first compare the phase of the EQ signal 34 to that of a feedback clock signal, such as the recovered clock signal 40. A phase error signal 72 output by the PD 70 may enter charge pump (CP) circuitry 74. Based on the phase error signal 72, the CP circuitry 74 may output a control signal 76 that causes a voltage-controlled oscillator (VCO) 78 to either increase (advance) or decrease (retard) the output clock signal 40.

To recover the data signal 38 from the EQ signal 34, a sampler 80 may sample the EQ signal 34 on the recovered clock signal 40. The resulting recovered data signal 38 represents a retimed serial data signal that more precisely matches the recovered clock signal 40. Additionally or alternatively, the CDR circuitry 36 may only partially deserialize the EQ signal 34. For such an embodiment, instead of producing the single serial data signal 38, the output of the sampler 80 may alternatively be two, four, or more signals, each of which may include a respective portion of incoming serial data. However, in the interest of simplicity, it may be understood that the output of the sampler 80 is only a single retimed serial signal.

Under normal operation, the select signal 50 is set to 0, such that the multiplexers 52 and 54 will pass the recovered data signal 38 and the recovered clock signal 40 to the deserializer 56. The deserializer 56 may output a parallel data signal 58 that consists of the recovered data from the CDR circuitry 36. When desired, a user may initiate an eye viewer mode via the eye viewer (EV) control signals 44, which may be received by eye viewer control logic 82. The control logic 82 may set the select signal 50 to 1, causing the multiplexers 52 and 54 to pass not the normal recovered data signal 38 and recovered clock signal 40, but rather the offset data signal 48 and the offset clock signal 46 to the deserializer 56.

In general, the CDR circuitry 36 may always remain active, regardless of whether the IC 10 is operating in a normal data recovery mode or an eye viewer mode. However, the eye viewer circuitry 42 may generally only be active when the EV control signal 44 provides a control signal to eye viewer control logic 82 to cause the eye viewer circuitry 42 to become active. The control logic 82 may operate as a state machine that performs an algorithm, which generally may be described below with reference to FIGS. 7 and 8.

When the IC 10 operates in the eye viewer mode, the control logic 82 may send a control signal 84 to a phase interpolator (PI) 86 and a control signal 88 to a threshold-variable comparator (TVC) 90. The PI 86 may receive the recovered clock signal 40 from the CDR circuitry 36 and, based on the control signal 84, may generate the offset clock signal 46 by altering the phase of the clock signal 40. The TVC 90 may receive and sample the EQ signal 34 on the offset clock signal 46 and at a threshold voltage Vt indicated by the control signal 88, outputting the offset data signal 48. Particularly, the TVC 90 may output a binary 1 if the EQ signal 34 exceeds the threshold voltage Vt on the offset clock signal 46 and may output a binary 0 if the EQ signal 34 is beneath the threshold voltage Vt on the offset clock signal 46.

In this way, varying the offset clock signal 46 to represent a different phase offset of the recovered clock 40 may cause the threshold-variable comparator (TVC) 90 to sample different horizontal portions of the eye of the EQ signal 34. Varying the threshold voltage Vt indicated by the control signal 88 may cause the TVC 90 to sample different vertical portions of the eye of the EQ signal 34. Thus, by varying the offset clock signal 46 via the control signal 84 and the threshold voltage Vt via the control signal 88, the control logic 82 may cause the TVC 90 to output data recovered from any location within the eye of the EQ signal 34. The operation of the TVC 90 with respect to the eye of the EQ signal 34 may be described in greater detail below with reference to FIG. 5.

Figure 5:
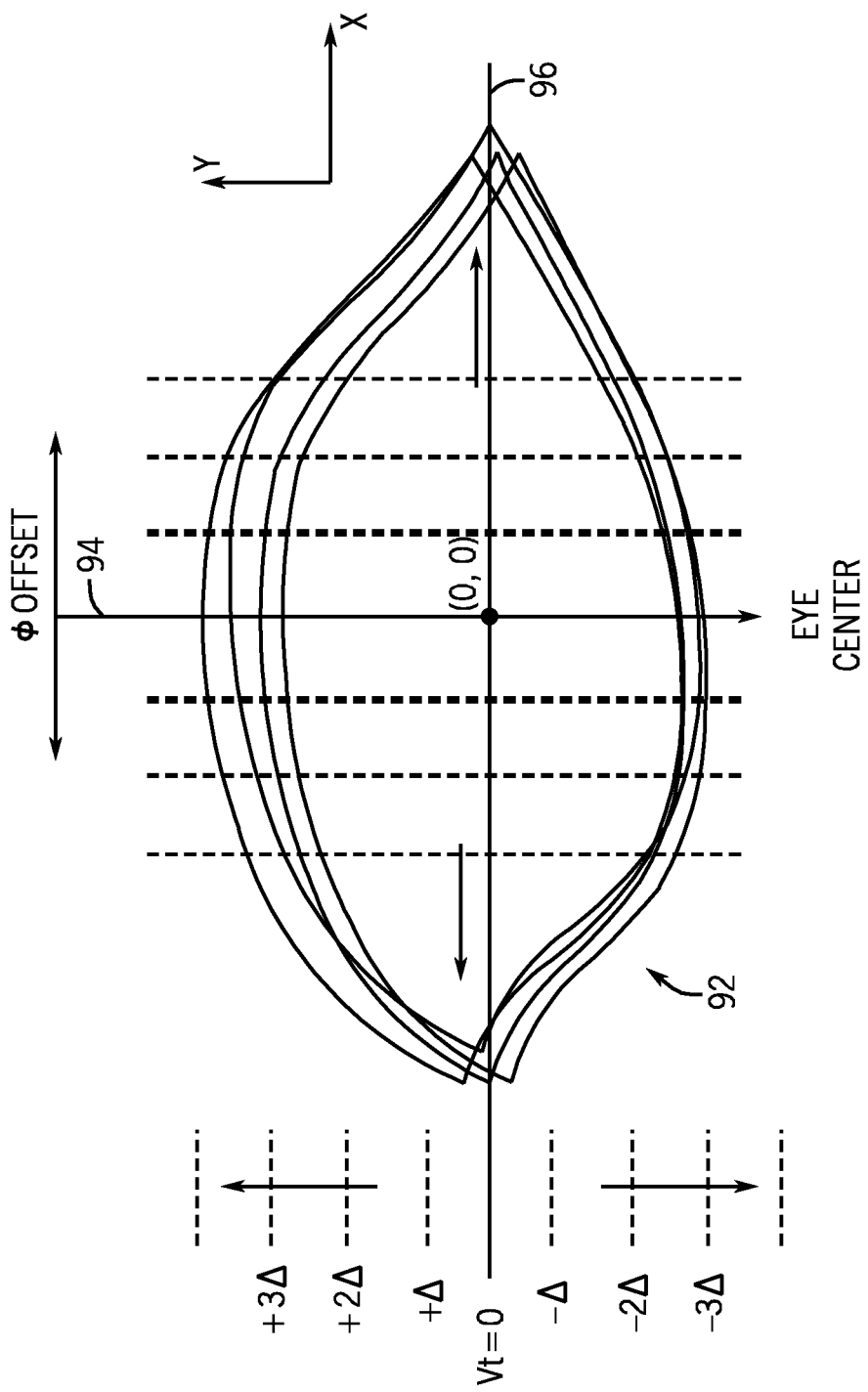
FIG. 5 is a schematic diagram representing a manner of controlling the circuitry of FIG. 4 to determine an eye diagram, in accordance with an embodiment.

FIG. 5 illustrates a schematic diagram of an eye 92 of the equalized (EQ) signal 34. The eye 92 of FIG. 5 represents the outer boundaries of the recoverable EQ signal 34, as might be apparent if the EQ signal 34 could be probed using an oscilloscope. In lieu of determining the shape of the eye 92 of the EQ signal 34 using an oscilloscope, which may be difficult or impossible for modern integrated circuits with very small components, the eye viewer circuitry 42 may determine the shape of the eye 92 by testing the EQ signal 34 signal quality at various points within the eye 92. In particular, the outer boundaries of the eye 92 may represent the quantity of phase offset from the clock signal 40 (reflected in the offset clock signal 46) and/or the threshold voltage Vt (reflected in the control signal 88) that, when applied to the threshold-variable comparator (TVC) 90 currently sampling the EQ signal 34, result in a recovered offset data signal 48 with less than a threshold error rate (reflected in the error rate signal 62).

To determine the shape of the eye 92 by testing the EQ signal 34 signal quality at various points within the eye 92, the control logic 82 may cause the TVC 90 to receive the offset clock signal 46 and the threshold voltage Vt in various combinations. The resulting recovered offset data signal 48 output by the TVC 90 may be tested for errors using the error checking circuitry 60. Specifically, varying the phase offset of the recovered clock signal 40 may enable the TVC 90 to sample the EQ signal 34 at different horizontal locations within the eye 92, while varying the threshold voltage Vt may enable the TVC 90 to sample the EQ signal 34 at different vertical locations within the eye 92. The center of the eye 92 may occur at a clock center 94, which may generally represent the unmodified clock signal 40, and at a baseline threshold voltage Vt 96, which may generally occur at 0V. As such, the center of the eye 92 is reflected in FIG. 5 at (x, y) coordinates of (0,0), in which the x-direction represents steps in the phase offset from the clock signal 40 and the y-direction represents steps in the threshold voltage Vt. Each integer increase in the (x, y) coordinates may represent one discrete increase or decrease in the phase offset amount or the threshold voltage Vt, respectively. The size of these discrete steps may be preprogrammed in the control logic 82 or may be provided to the control logic 82 by an external device via the EV control signals 44. The greater the granularity of the discrete steps, the higher the resolution of a resulting eye diagram of the eye 92.

The control logic 82 of the eye viewer circuitry 42 may cause the TVC 90 to sample the eye 92 of the EQ signal 34 at such discrete horizontal and vertical steps, observing the resulting error rate signal 62 for the output offset data 48, until all boundaries of the eye 92 have been determined. One such algorithm for doing so is described below with reference to FIGS. 7 and 8. The control logic 82 may output the (x, y) coordinates of the determined boundaries of the eye 92 in the EV output signals 64, from which an external device may construct a corresponding two-dimensional (2-D) eye diagram, such as the eye diagram illustrated in FIG. 6. Since the boundaries of such a 2-D eye diagram depend upon the error rates, different error rates will generally give different 2-D eye diagrams. Additionally or alternatively, the control logic 82 may output the (x, y) coordinates as each of the locations in the eye 92 are tested for errors in the EV output signals 64. An external device may receive both the (x, y) coordinates and the corresponding test error rates associated with the (x, y) coordinates to construct a three-dimensional (3-D) eye diagram. Such a 3-D eye diagram, which may include the eye diagram illustrated in FIG. 9, may represent not only the vertical and horizontal boundaries of the eye 92, but also the tested error rates at each (x, y) coordinate of the eye 92.

Figure 6:
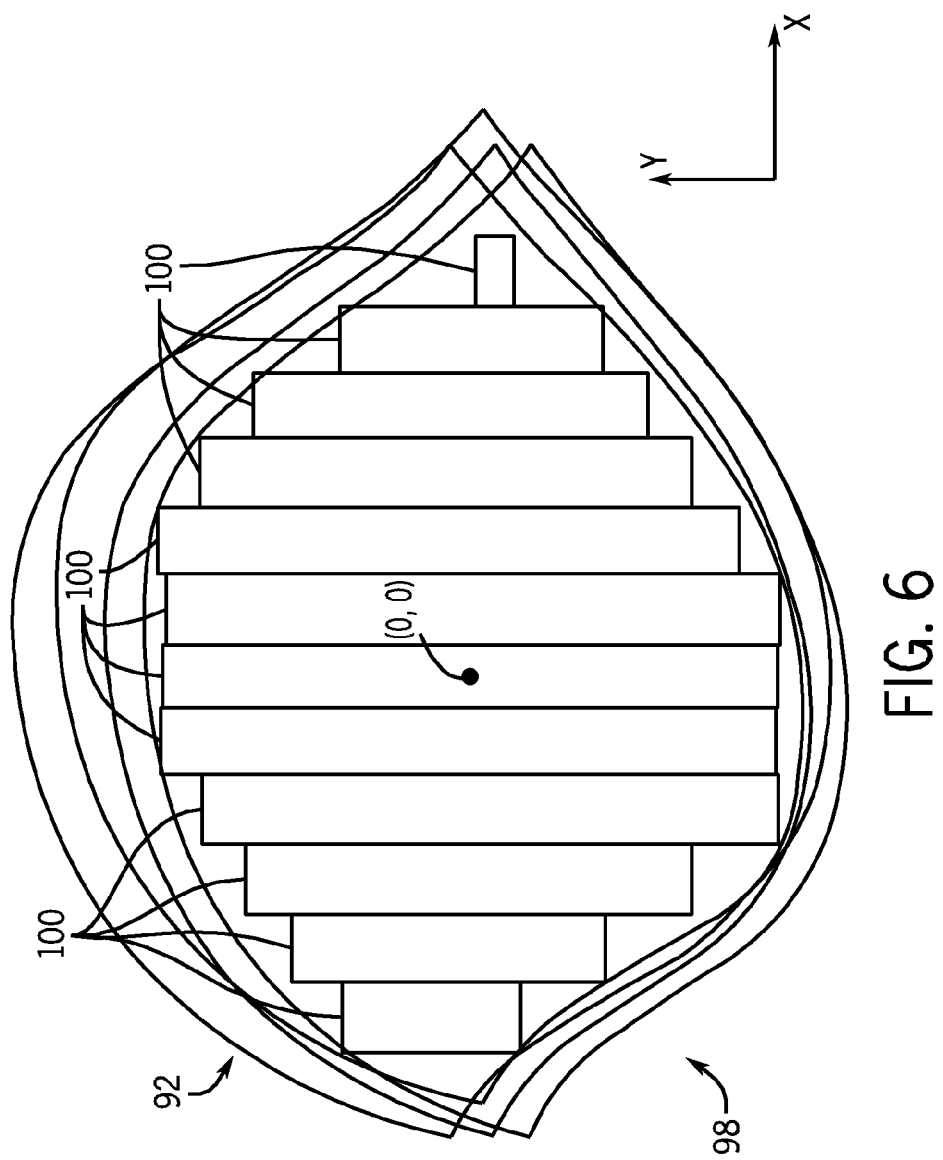
FIG. 6 is a schematic diagram of a two-dimensional (2-D) eye diagram that may be determined using the circuitry of FIG. 4, in accordance with an embodiment.

FIG. 6 illustrates one example of a two-dimensional (2-D) eye diagram 98 that may be constructed by an external device based on EV output signals 64 provided by the eye viewer circuitry 42. In the eye diagram 98, the upper and lower bounds of the threshold voltage Vt for each discrete phase offset position are represented by columns 100. Each of the columns 100 is aligned with a different discrete phase offset position, from a leftward horizontal boundary position to a rightward horizontal boundary.

Figure 7:
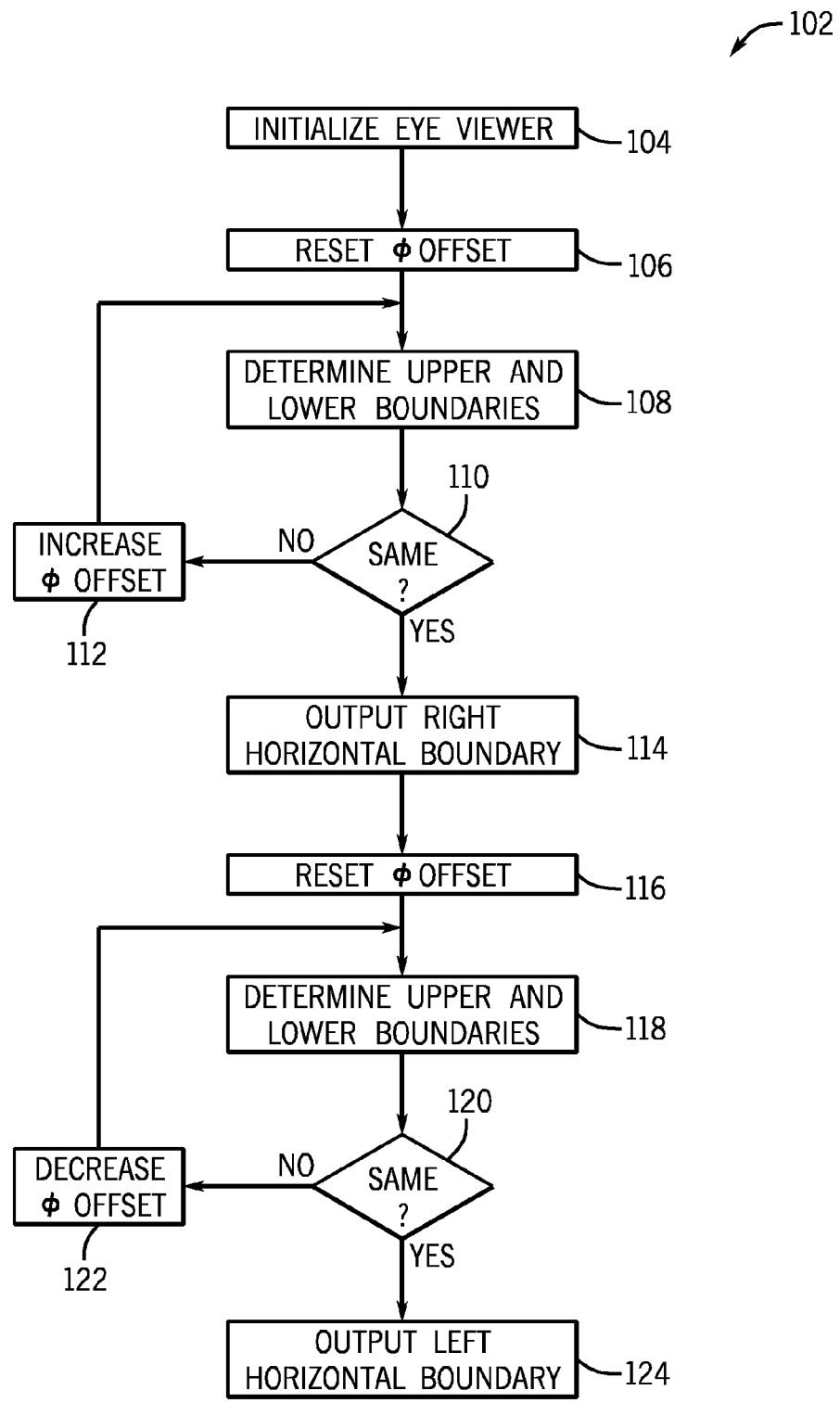
FIGS. 7 and 8 are flowcharts describing an embodiment of a method for determining the eye diagram of FIG. 6.
Figure 8:
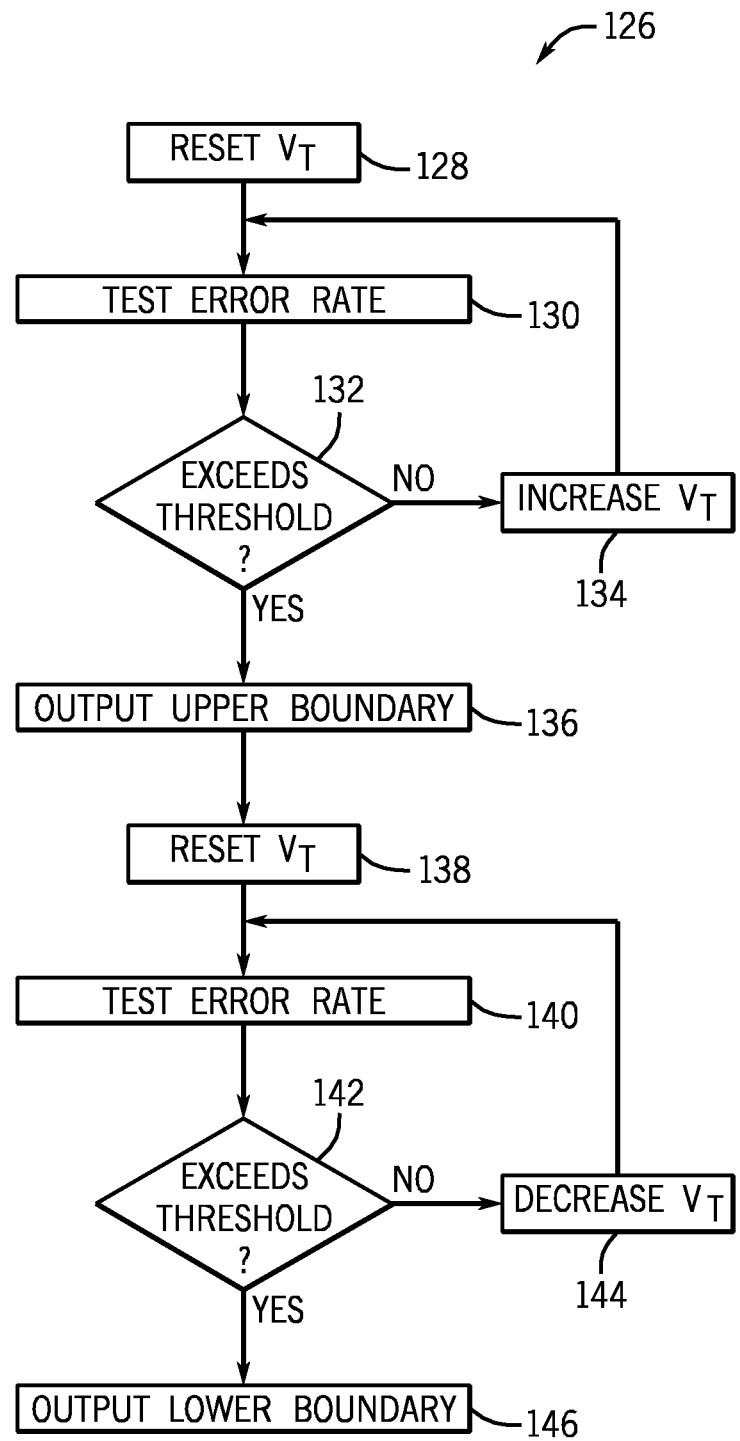

FIGS. 7 and 8 represent flowcharts that describe an embodiment of a method for determining a two-dimensional (2-D) eye diagram, such as the eye diagram 98 illustrated in FIG. 6. Generally, the flowcharts of FIGS. 7 and 8 represent algorithms that may be preformed by the control logic 82 or, additionally or alternatively, by a processor on an external device that may control the control logic 82 via the EV control signals 44. Specifically, FIG. 7 is a flowchart for sweeping the eye 92 of the EQ signal 34 horizontally to determine horizontal eye boundaries, and FIG. 8 is a flowchart for sweeping the eye 92 of the EQ signal 34 vertically to determine vertical eye boundaries. To fully determine the 2-D boundaries of the eye 92, the flowcharts of FIGS. 7 and 8 may generally be used in combination. It should be understood that the horizontal and vertical sweeping described by FIGS. 7 and 8 may be performed in any order (e.g., first sweeping to the right or to the left, or first sweeping up or down) while the many coordinates of the eye 92 of the EQ signal 34 are sampled to ascertain the outer boundaries of the eye 92. Though FIGS. 7 and 8 describe an embodiment that involves determining upper and lower vertical boundaries for each horizontal selection of the eye 92, alternative embodiments may involve determining leftward and rightward boundaries for each vertical selection of the eye 92.

Turning first to FIG. 7, a flowchart 102 represents an embodiment of a method for sweeping the eye 92 of the EQ signal 34 horizontally. In a first step 104, the EV control signals 44 may cause the logic 82 to initialize the eye viewer circuitry 42. Such initialization may include, for example, causing the select signal 50 to set the multiplexers 52 and 54 such that the deserializer 56 receives the offset data signal 48 and the offset clock signal 46 so as to output the parallel data signal 58. As described above, this parallel data signal 58 may enter the error checking circuitry 60 to produce the error rate signal 62, which may be employed by the control logic 82 in determining the eye diagram 98.

Steps 106-112 describe a manner of determining a first horizontal half of the eye diagram 98. In particular, in step 106, the control logic 82 may send a control signal 84 to the phase interpolator (PI) 86 to such that no phase offset is applied to the clock signal 40. Thus, the offset clock signal 46 sent to the threshold-variable comparator (TVC) 90 may sample data from the center of the eye 92 of the EQ signal 34. In step 108, as described in greater detail below with reference to FIG. 8, the control logic 82 may vary the threshold voltage Vt control signal 88 to determine the upper and lower vertical boundaries of the eye 92 for the current offset clock signal 46. Thus, in the first iteration of step 108, the control logic 82 may determine a first column 100 of the eye diagram along the clock center 94 of the eye 92 of the EQ signal 34. Also during step 108, the control logic 82 may output via the EV output signal 64 a representation of the location of the outer vertical upper and lower boundaries as they are determined.

After the vertical boundaries of the particular horizontal slice of the eye 92 of the EQ signal 34 have been determined in step 108, a decision block 110 may assess whether a horizontal boundary has been reached, which may occur when the determined vertical boundaries are the same. If the horizontal boundary has not been reached, the process may flow to step 112. In step 112, the phase offset may be increased by a discrete amount to sample the next horizontal slice of the eye 92. In another iteration of step 108, upper and lower boundaries may be determined for the new horizontal slice of the eye 92. Steps 110, 112, and 108 may repeat until the first horizontal boundary of the eye 92 is reached. When decision block 110 determines that a horizontal boundary has been reached, as may occur when the upper and lower boundaries in a particular horizontal slice of the eye 92 are the same, the process may flow to step 114. In step 114, the control logic 82 may or output an indication that the first horizontal boundary has been reached via the EV output signal 64.

Having obtained the first horizontal boundary, the control logic 82 may thereafter determine the second horizontal boundary, as generally described via steps 116-124. Steps 116-124 may respectively take place in substantially the same way as steps 106-114, with the exception that the phase offset may be decreased, rather than increased, in step 122.

FIG. 8 represents a flowchart 126 describing an embodiment of a method for determining the upper and lower boundaries of the eye 92 of the EQ signal 34 at a given horizontal phase offset of the eye 92. As such, the flowchart 126 of FIG. 8 may generally represent steps 108 and 118 of the flowchart 102 of FIG. 7. In particular, steps 128-136 represent steps for determining the upper boundary, while steps 138-146 represent steps for determining the lower boundary.

In step 128, the control logic 82 may reset the threshold voltage Vt signal 88. At this point, the threshold-variable comparator (TVC) 90 may be sampling the EQ signal 34 at approximately the vertical center 96 of the eye 92. In step 130, after the resulting offset data signal 48 has been deserialized in the deserializer 56 and routed through the error checking circuitry 60, the error rate signal 62 may be tested. Generally, the closer to the vertical eye center 96 and the horizontal eye center 94, the lower the error rate indicated by the error rate signal 62. As noted above, the error rate signal 62 may represent a bit error rate (BER) of the parallel data signal 58 or of a portion of the data signal 58, or may represent a cyclic redundancy check (CRC) of all or part of the parallel data 58.

It should be noted, that the error rate signal 62 may be known if the data contained in the RX input signal 18 is known. However, even if the data contained in the RX input signal 18 is not known, polarity bits of data contained in the RX input signal 18 may be known. Under such conditions, the error checking circuitry 60 may specifically check for errors in the polarity bits of the output parallel data 58.

The error rate of the offset data 48 may increase as the TVC 90 progressively samples horizontal and vertical points in the eye 92 located further from the clock center 94 and the vertical eye center 96. Indeed, a point at which a threshold error rate is exceeded may mark the boundary of the eye of the recoverable EQ signal 34, beyond which the quality of the signal may drop dramatically. Such a threshold error rate may include, for example, a bit error rate (BER) of approximately $10^{-12}$, which may generally correspond to a maximum acceptable optical data error rate. However, it should be appreciated that the threshold error rate may be set to any desired rate, and may include, for example, a BER of $10^{-15}$, $10^{-12}$, $10^{-9}$, $10^{-5}$, etc. For reference, the sampling point in the eye 92 at (0, 0) may generally have a BER below approximately $10^{-12}$.

The error rate indicated by the error rate signal 62 may enter the control logic 82, which may test whether the error rate exceeds the threshold, as indicated by the decision block 132. If the error rate indicated by the error signal 62 does not exceed the threshold, the upper boundary has not been reached for the given phase offset and the process may flow to step 134. In step 134, the threshold voltage Vt may be increased by a discrete amount and the TVC 90 may begin to sample the eye 92 of the EQ signal 34 at a higher vertical location. In another iteration of step 130, the error rate of the offset data 48 may be tested again. Returning to the decision block 132, when the control logic 82 eventually determines that the error rate of the error rate signal 62 has exceeded the threshold, an upper vertical boundary has been reached, and the process may flow to step 136. In step 136, the control logic 82 may output the (x, y) coordinates of the upper boundary.

Having obtained the upper boundary of the current horizontal slice of the eye 92 of the EQ signal 34, the control logic 82 may determine the lower boundary in steps 138-146. Steps 138-146 of the flowchart 126 may respectively perform in substantially the same manner as steps 128-136, except that the threshold voltage Vt signal 88 may be decreased, rather than increased, in step 144.

Figure 9:
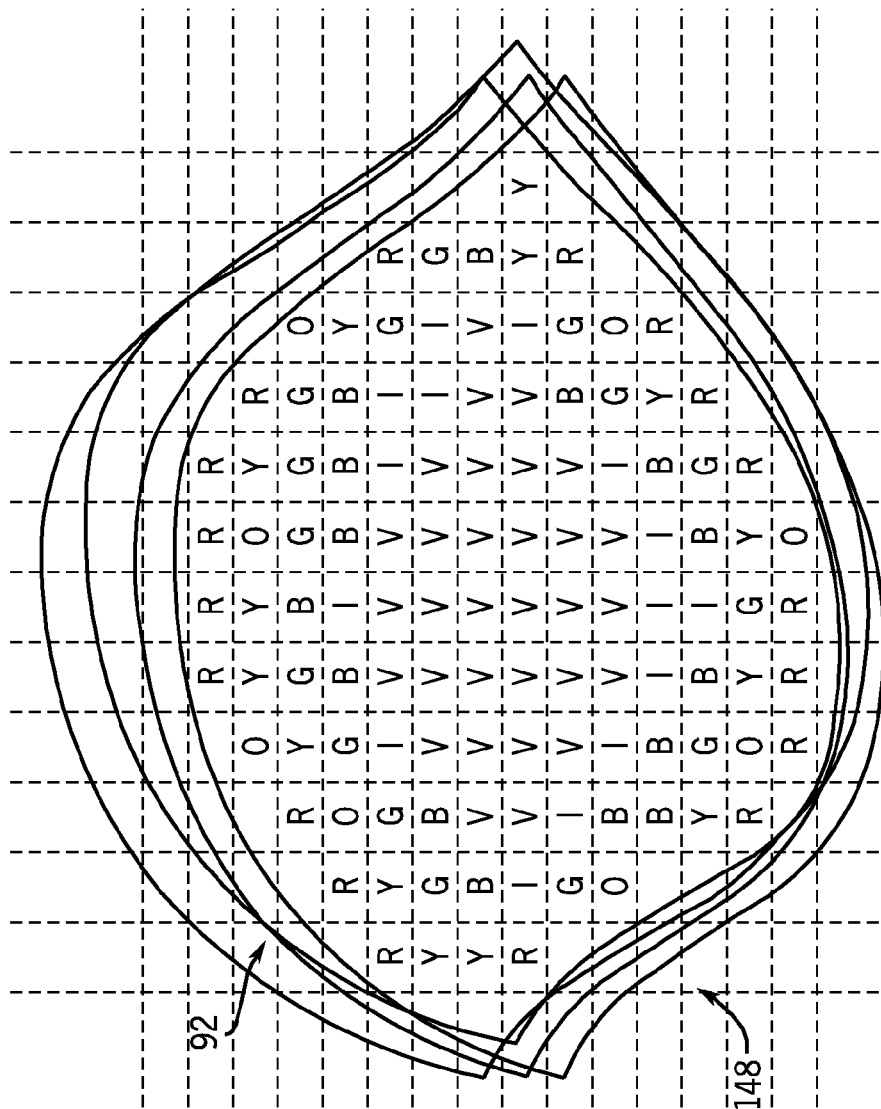
FIG. 9 is a schematic diagram of a three-dimensional (3-D) eye diagram that may be determined from the circuitry of FIG. 4, in accordance with an embodiment.

As described in the flowcharts of FIG. 7 and FIG. 8, the control logic 82 may output via the EV output signal 64 (x, y) coordinates describing outer boundaries of the eye 92, which may be used to construct the eye diagram 98. Additional data may be provided that may be used by an external device to construct a three-dimensional (3-D) eye diagram 148, as illustrated in FIG. 9. In particular, the eye diagram 148 of FIG. 9 includes the (x, y) shape of the eye 92 of the EQ signal 34, as well as a (z) coordinate representing the tested error rate for each (x, y) coordinate. In the embodiment of the eye diagram 148 shown in FIG. 9, the error rate, or (z) coordinates, may be approximated using certain colors. For example, on a scale that includes red (R), orange (O), yellow (Y), green (G), blue (B), indigo (I), and violet (V), each of the colors may represent a range of bit error rates (BER) or cyclic redundancy check (CRC) error rates. By way of example, V may represent a BER of approximately $10^{-20}$ and R may represent a BER approaching $10^{-12}$, with the other colors representing intermediate BER values. Based on the 3-D eye diagram 148, an integrated circuit designer or field engineer may adjust the settings of the equalizer (EQ) 30 not only to open the eye 92, but also to lower the error rate throughout the eye 92.

To obtain the eye diagram 148 using the eye viewer circuitry 42, the flowchart 126 of FIG. 8 may be modified slightly. In steps 130 and 140, when the error rate signal 62 is received by the control logic 82, the EV output signal 64 may indicate the current coordinates (x, y, z), where x represents the current phase offset, y represents the current threshold voltage Vt, and z represents the current error rate indicated by the error rate signal 62. Additionally or alternatively, the control logic 82 may not supply the error rate via the EV output signal 64, but may simply supply the current (x, y) coordinates as each location in the eye 92 is tested. Under such conditions, another output signal of the IC 10 may provide the error rate. In either case, an external device may use such data to construct the 3-D eye diagram 148.

Figure 10:
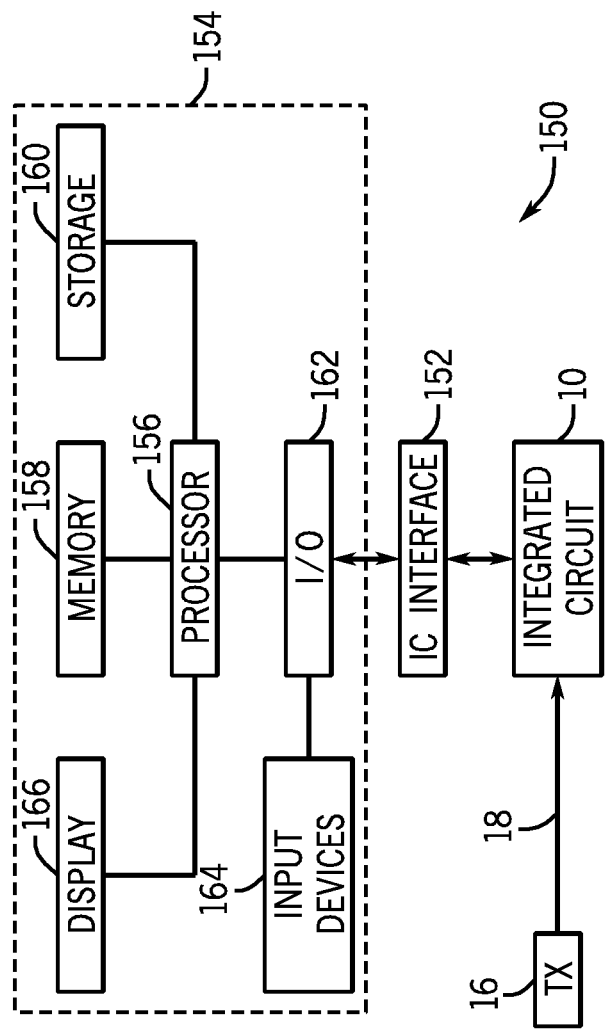
FIG. 10 is a block diagram of a system for constructing and displaying the eye diagrams of FIGS. 6 and/or 9, in accordance with an embodiment.

FIG. 10 represents illustrates a system 150 for displaying a two-dimensional (2-D) or three-dimensional (3-D) eye diagram, such as the eye diagram 98 of FIG. 6 or 148 of FIG. 9. The system 150 may also be used to tune the equalizer (EQ) 30 using EQ control signals 32 to "open" the eye 92 of the EQ signals 34. As illustrated in FIG. 10, the system 150 includes the integrated circuit (IC) 10, which receive the receiver (RX) input signal 18 from the transmitter (TX) 16. An IC interface 152 may enable communication between the IC 10 and a data processing system 154. Such an IC interface 152 may include, for example, programmable logic device (PLD) logic within field programmable gate array (FPGA) circuitry. The IC interface 152 may operate in conjunction with FPGA software, such as Quartus® by Altera Corporation, which may enable programming of intellectual property (IP) into the IC 10. Additionally or alternatively, the data may be sent out via normal FPGA I/O pins of the IC 10. The receiving party may include, for example, the data processing system 154 or test equipment such as an oscilloscope. Such data processing system 154 or test equipment may generally process and construct an eye diagram in software or hardware using the techniques described below.

The data processing system 154 may include, among other things, a processor 156 coupled to memory 158, a storage device 160, input/output (I/O) resources 162 (which may communicably couple the processor 156 to various input devices 164), and a display 166. The memory 158 and/or storage 160 may store one or more algorithms for constructing an eye diagram, such as the eye diagram 98 of FIG. 6 or 148 of FIG. 9, based on the EV output signals 64 received from the integrated circuit 10 via the IC interface 152. Such algorithms may include those described below with reference to FIGS. 11 and 12. The data processing system 154 may use these algorithms to construct an eye diagram for display on the display 166.

While observing the eye diagram on the display 166, a designer or field engineer may adjust the equalization provided by the EQ 30 using EQ control signals 32. Since the eye diagram displayed on the display 166 represents the EQ signal 34, changes in the EQ control signals 32 may be reflected in the eye diagram. In this way, a designer or field engineer may view the actual effect, and not merely a simulation, of adjustments to the EQ 30. Thus, a designer or field engineer may adjust the EQ 30 to "open" the eye 92 of the EQ signal 34, as well as to reduce the error rate distributed across the eye 92. The constructed eye diagram may also be used for diagnostic or debug purposes only, without adjusting the EQ 30, in the field.

Figure 11:
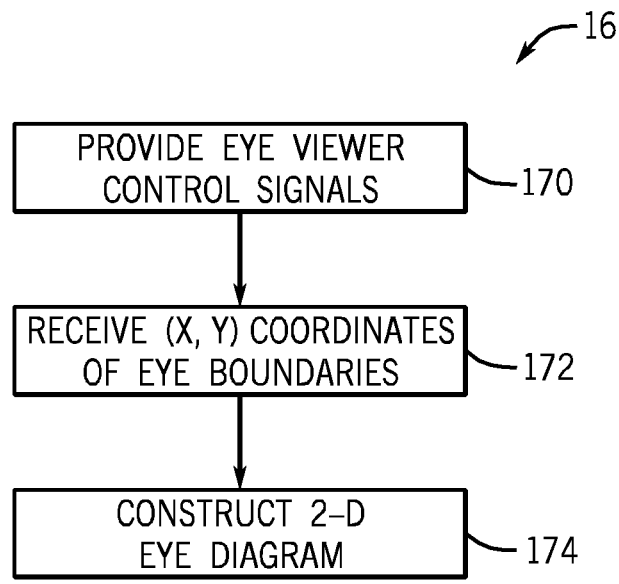
FIG. 11 is a flowchart describing an embodiment of a method for constructing a two-dimensional (2-D) eye diagram using the system of FIG. 10.
Figure 12:
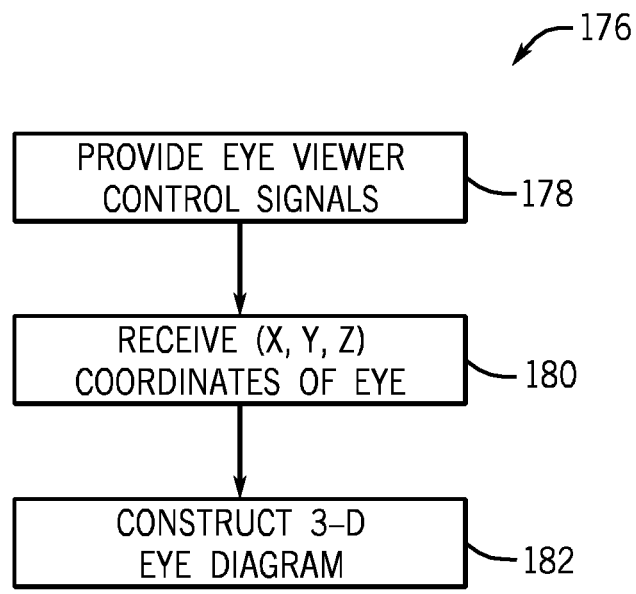
FIG. 12 is a flowchart describing an embodiment of a method for constructing a three-dimensional (3-D) eye diagram using the system of FIG. 10.

FIGS. 11 and 12 represent flowcharts describing embodiment of methods for constructing a two-dimensional (2-D) eye diagram, such as the eye diagrams 98 of FIG. 6, or a three-dimensional (3-D) eye diagram, such as the eye diagram 148 of FIG. 9, respectively. Turning first to FIG. 11, a flowchart 168 describes an embodiment of a method for constructing a 2-D eye diagram from EV output signals 64 output by the control logic 82 of the eye viewer circuitry 42. In a first step 170, the integrated circuit (IC) 10 may output EV output signals 64, which may include the (x, y) coordinates of outer boundaries of the eye 92 of the EQ signal 34. In step 172, the data processing circuitry 154 may receive such (x, y) coordinates. In step 174, the data processing circuitry 154 may use the (x, y) coordinates of the eye 92 boundaries to construct a 2-D eye diagram in the manner of the eye diagram 98 of FIG. 6, which may be displayed on the display 166. If desired, one or more smoothing algorithms may be applied to interpolate the edges of the resulting eye diagram.

A flowchart 176 of FIG. 12 describes an embodiment of a method for constructing a three-dimensional (3-D) eye diagram, such as the eye diagram 148 of FIG. 9. Like the flowchart 168 of FIG. 11, in a first step 178, the integrated circuit (IC) 10 may output EV output signals 64, which may include the (x, y) coordinates of each sampled location of the eye 92 of the EQ signal 34 and the corresponding error rate indicated by the error rate signal 62. Additionally or alternatively, the error rate may be transmitted from the IC 10 via one or more signals other than the EV output signals 64. In step 180, the data processing circuitry 154 may receive such (x, y) coordinates and the corresponding error rates. In step 174, the data processing circuitry 154 may use the (x, y) coordinates of the eye 92 boundaries to construct a general 2-D shape of the eye diagram, over which the error rates may be laid to produce a 3-D eye diagram. In some embodiments, the error rates may represent a distance in the z-direction, while in other embodiments, ranges of error rates may be assigned certain colors and overlaid across the eye diagram, such as represented by the eye diagram 148 of FIG. 9. Some embodiments may represent the error rates as both distances in the z-direction and as overlaid colors. If desired, one or more smoothing algorithms may be applied to smooth the edges and error rates of the resulting eye diagram.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An integrated circuit device comprising:
   internal circuitry configured to propagate an equalized serial signal based at least in part on a received serial input signal; and
   eye viewer circuitry configured to determine horizontal and vertical boundaries of an eye diagram associated with the equalized serial signal, wherein the eye viewer circuitry is configured to determine the horizontal and vertical boundaries of the eye diagram by:
   sampling the equalized serial signal at variable phase offsets from a clock signal associated with the equalized serial signal and at variable threshold voltages; and
   testing an error rate associated with the sampled signal, wherein the error rate is determined based at least in part on:
   known data of at least a subset of the received serial input signal;
   a cyclic redundancy check (CRC) of the received serial signal; or
   a combination thereof.

2. The device of claim 1, wherein the equalized serial signal operates at between approximately 6 and 12 Gbps.

3. The device of claim 1, wherein the eye viewer circuitry is configured to determine the horizontal and vertical boundaries of the eye diagram when the device is operating in an eye viewer mode.

4. The device of claim 3, wherein the device is configured to enter the eye viewer mode when the eye viewer circuitry receives a control signal from an external device.

5. The device of claim 1, wherein the eye viewer circuitry is configured to output the error rate associated with horizontal and vertical locations of an eye of the equalized serial signal.

6. The device of claim 1, wherein the device is a programmable logic device.

7. The device of claim 1, wherein the subset of the received serial input signal comprises polarity bits of data within the received serial input signal.

8. An integrated circuit device comprising:
   a phase interpolator configured to receive a clock signal and a phase control signal and shifting the phase of the clock signal based at least in part on the phase control signal to produce an offset clock signal;
   a threshold variable comparator configured to receive an equalized serial input signal, the offset clock signal, and a threshold voltage control signal, and sampling the equalized serial input signal at the offset clock signal and at a threshold voltage indicated by the threshold voltage control signal to produce an offset data signal;
   error checking circuitry configured to:
   detect an error rate of the offset data signal, wherein the error rate is determined based at least in part on data contained in the offset data signal and known data contained in a serial input signal used to generate the equalized serial input signal; and
   produce an error rate signal based at least in part on the error rate; and
   control logic configured to receive the error rate signal and generate the phase control signal and the threshold voltage control signal to determine an eye diagram associated with the serial input signal based at least in part on the error rate indicated by the error rate signal.

9. The device of claim 8, comprising clock and data recovery circuitry configured to receive the equalized serial input signal and determining the clock signal based on the equalized serial input signal.

10. The device of claim 8, wherein the error checking circuitry is configured to detect a cyclic redundancy check error rate.

11. The device of claim 8, wherein the known data contained in the serial input signal includes priority bits of the serial input signal.

12. The device of claim 8, wherein the control logic is configured to determine vertical boundaries of the eye diagram by increasing or decreasing the threshold voltage indicated by the threshold voltage signal until the error rate exceeds a threshold.

13. The device of claim 8, wherein the control logic is configured to determine horizontal boundaries of the eye diagram by increasing or decreasing the phase control signal until the error rate exceeds a threshold.

14. The device of claim 8, wherein the control logic is configured to output signals representing horizontal and vertical coordinates of the eye diagram that correspond respectively to the offset clock signal and the threshold voltage received by the threshold variable comparator.

15. The device of claim 14, wherein the device is configured to output signals representing the error rate associated with the data contained in the offset data signal for each of the horizontal and vertical coordinates of the eye diagram.

16. A method comprising:
receiving a serial input signal into a receiver;
equalizing the received serial input signal;
sampling the equalized serial input signal at discrete horizontal and vertical positions of an eye of the received serial input signal using a threshold variable comparator;
determining an error rate associated with the sampled signal using error checking circuitry, wherein the error rate is determined based at least in part on:
known data of at least a subset of the received serial input signal;
a cyclic redundancy check (CRC) of the received serial signal; or
a combination thereof; and
determining a boundary of the eye of the equalized serial input signal when the determined error rate exceeds a maximum acceptable error rate.

17. The method of claim 16, wherein sampling the equalized serial input signal comprises selecting a horizontal position of the eye of the received input signal and increasing or decreasing the vertical position until the boundary of the eye of the received signal is determined.

18. The method of claim 16, wherein sampling the equalized serial input signal comprises selecting a vertical position of the eye of the received input signal and increasing or decreasing the horizontal position until the boundary of the eye of the received signal is determined.

19. The method of claim 16, comprising repeating the steps of sampling the equalized serial input signal, determining the error rate of the sampled signal, and determining the boundary of the eye of the equalized serial input signal until all boundaries of the eye of the equalized serial input signal are determined.

20. The method of claim 16, wherein the maximum acceptable error rate is no greater than an optical fiber error rate.

21. A method comprising:
receiving a serial signal into a receiver;
performing equalization on the received serial signal using an equalizer;
sampling the equalized signal at variable phase offsets from a clock signal associated with the equalized signal and at variable threshold voltages using a threshold variable comparator;
detecting an error rate in the sampled signal using error checking circuitry, wherein the error rate is determined based at least in part on known data of at least a subset of the received serial signal; and
determining an eye diagram of the equalized signal based at least in part on the detected error rate using logic circuitry configured to control the threshold variable comparator.

22. The method of claim 21, comprising recovering the clock signal associated with the equalized signal using clock and data recovery circuitry.

23. The method of claim 21, comprising transmitting a signal, from an external device to the equalizer, configured to cause the equalizer to perform equalization on the received serial signal such that the eye diagram of the equalized signal is more open.

24. A method comprising:
receiving, into a processor, eye diagram coordinates from an integrated circuit device equalizing a serial input signal and having eye diagram circuitry configured to determine the eye diagram coordinates based at least in part on an error rate associated with data sampled from horizontal and vertical locations of an eye of the equalized serial input signal and known data of at least a subset of the serial input signal; and
constructing, using the processor, an eye diagram associated with the equalized serial input signal based at least in part on the received eye diagram coordinates.

25. The method of claim 24, wherein the constructed eye diagram is a two-dimensional eye diagram that indicates a horizontal and vertical shape of the eye of the equalized input signal.

26. The method of claim 24, comprising receiving, into the processor, the error rate associated with the data sampled from the horizontal and vertical locations of the eye of the equalized serial input signal and the known data of at least a subset of the serial input signal.

27. The method of claim 26, wherein the constructed eye diagram is a three-dimensional eye diagram that indicates the error rates associated with the horizontal and vertical locations of the eye of the equalized serial input signal.

28. The method of claim 27, wherein the constructed eye diagram indicates the error rates with colors or distances, or a combination thereof.

29. The method of claim 24, wherein equalizing the serial input signal is configured to cause the eye of the equalized serial input signal to become more open.

* * * * *